(12) United States Patent
Lin et al.

(10) Patent No.: US 8,609,529 B2
(45) Date of Patent: Dec. 17, 2013

(54) FABRICATION METHOD AND STRUCTURE OF THROUGH SILICON VIA

(75) Inventors: Chin-Fu Lin, Tainan (TW); Chun-Yuan Wu, Yun-Lin County (TW); Chih-Chien Liu, Taipei (TW); Teng-Chun Tsai, Tainan (TW); Chin-Cheng Chien, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/363,390

(22) Filed: Feb. 1, 2012

(65) Prior Publication Data

US 2013/0193585 A1 Aug. 1, 2013

(51) Int. Cl.
*H01L 21/4763* (2006.01)

(52) U.S. Cl.
USPC ........... 438/618; 438/622; 438/637; 438/667; 438/690; 257/E21.549

(58) Field of Classification Search
None
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |
| 5,753,561 A * | 5/1998 | Lee et al. ...................... 438/424 |
| 5,793,115 A | 8/1998 | Zavracky |
| 5,882,535 A * | 3/1999 | Stocks et al. ................... 216/18 |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,300,683 B1 * | 10/2001 | Nagasaka et al. ............. 257/774 |
| 6,309,956 B1 | 10/2001 | Chiang |
| 6,391,777 B1 | 5/2002 | Chen |
| 6,407,002 B1 | 6/2002 | Lin |

(Continued)

*Primary Examiner* — Kyoung Lee
(74) *Attorney, Agent, or Firm* — Winston Hsu; Scott Margo

(57) ABSTRACT

A method of fabricating a through silicon via (TSV) structure, in which, a patterned mask is formed on a substrate, the patterned mask has an opening, a spacer-shaped structure is formed on a sidewall of the opening, and a via hole having a relatively enlarged opening is formed by etching the spacer-shaped structure and the substrate through the opening after the spacer-shaped structure is formed. A TSV structure, in which, a via hole has an opening portion and a body portion, the opening portion is a relatively enlarged opening and has a tapered shape having an opening size of an upper portion greater than an opening size of a lower portion.

12 Claims, 5 Drawing Sheets

(56) References Cited

U.S. PATENT DOCUMENTS

| | | |
|---|---|---|
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,670,279 B1 | 12/2003 | Pai |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Brigham et al. |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,105,431 B2 | 9/2006 | Yin |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,732,926 B2 | 6/2010 | Uchiyama |
| 7,846,837 B2 | 12/2010 | Kuo |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2006/0094231 A1* | 5/2006 | Lane et al. .................. 438/637 |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0140749 A1 | 6/2010 | Kuo |
| 2010/0140772 A1 | 6/2010 | Lin |
| 2010/0244247 A1 | 9/2010 | Chang |
| 2010/0323478 A1 | 12/2010 | Kuo |
| 2012/0261827 A1* | 10/2012 | Yu et al. ..................... 257/774 |

* cited by examiner

FABRICATION METHOD AND STRUCTURE OF THROUGH SILICON VIA

BACKGROUND OF THE INVENTION

1. Field of the Invention

The present invention relates to a fabrication method and a structure of a through silicon via.

2. Description of the Prior Art

In the field of semiconductor technology, the response speed of IC circuits is related to the linking distance between devices disposed on a chip. For signal to be transmitted, the shorter the linking distance is, the faster the operational speed of a circuit device can be. Since the vertical distance between adjacent layers may be much shorter than the width of a single-layer chip, IC circuits with a three-dimensional structure can shorten the linking distances of devices disposed on a chip. Accordingly, their operational speed can be increased when a chip is designed with a vertical packed structure in 3D IC schemes. In order to integrate different devices in one single stacked structure chip, interconnects are required between die and die to electrically connect the devices on each level. The through silicon via (TSV) is one of the novel semiconductor techniques developed for this purpose. TSV technique produces devices that meet the market trends of "light, thin, short and small" through the 3D stacking technique and also provides wafer-level packages utilized in micro electronic mechanic system (MEMS), photo-electronics and electronic devices.

Nowadays, the TSV structure is usually obtained by performing the following steps: first, forming via hole on the front side of a wafer by etching or laser process. Secondly, filling the via hole with a conductive material, such as polysilicon, copper or tungsten, to form a conductive path (i.e. the interconnect structure). Finally, the back side of the wafer, or die, is thinned to expose the conductive path. After the manufacture of the TSV, the wafers or dies are stacked together so that their conductive paths are connected to each other to provide electrical connection between wafers or dies. The 3D-stacked IC structure is accordingly obtained.

SUMMARY OF THE INVENTION

An objective of the present invention is to provide a fabrication method and a structure of a through silicon via to solve or mitigate TSV vertical-profile-induced liner overhang and metal gap fill voiding issues.

According to one embodiment of the present invention, a method of fabricating a through silicon via structure includes steps as follows. A patterned hard mask is formed on a substrate. The patterned hard mask has an opening. A spacer-shaped structure is formed on a sidewall of the opening. After the spacer-shaped structure is formed, the spacer-shaped structure and the substrate are etched through the opening to form a via hole in the substrate. The via hole has a relatively enlarged opening.

According to another embodiment of the present invention, a through silicon via structure includes a substrate, a dielectric liner and a conductive material. The substrate includes a via hole. The via hole has an opening portion and a body portion. The opening portion has a tapered shape. The tapered shape has an opening size at an upper portion greater than an opening size at a lower portion. The body portion has a column shape, substantial column shape, column shape having a hole diameter gradually decreasing from its lower portion to its bottom, or substantial column shape having a hole diameter gradually decreasing from its lower portion to its bottom. The dielectric liner covers a sidewall of the via hole. The conductive material is allowed to fill the via hole having the dielectric liner covering the sidewall.

In one embodiment of the present invention, a via hole is formed to have an opening portion and a body portion, and the opening size at an upper portion of the opening portion is greater than the opening size at a lower portion of the opening portion, to avoid the overhang problem.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
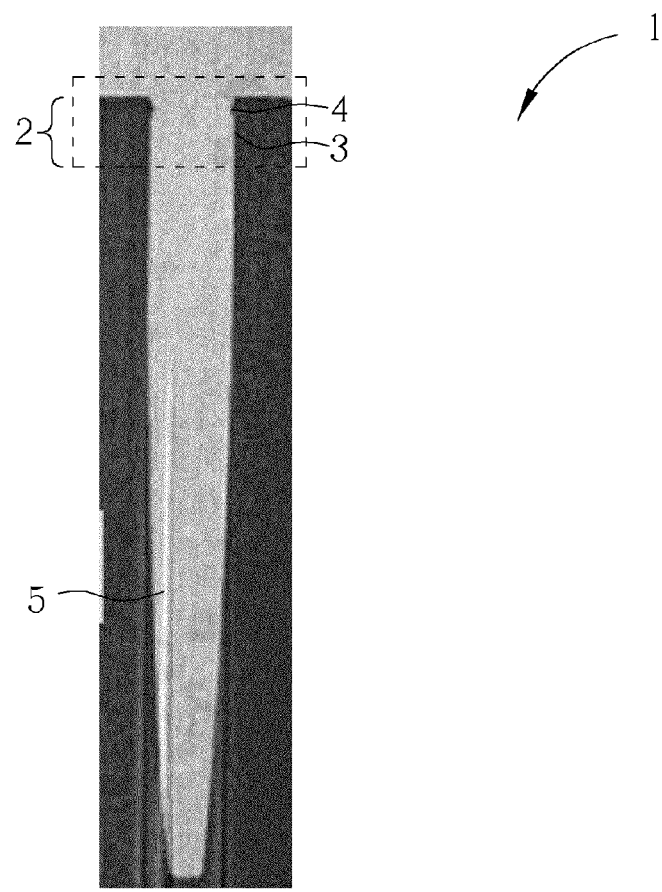
FIG. 1 shows an electric scanning microscopic photograph showing a kink formed on a sidewall of an opening portion of a via hole.
Figure 2:
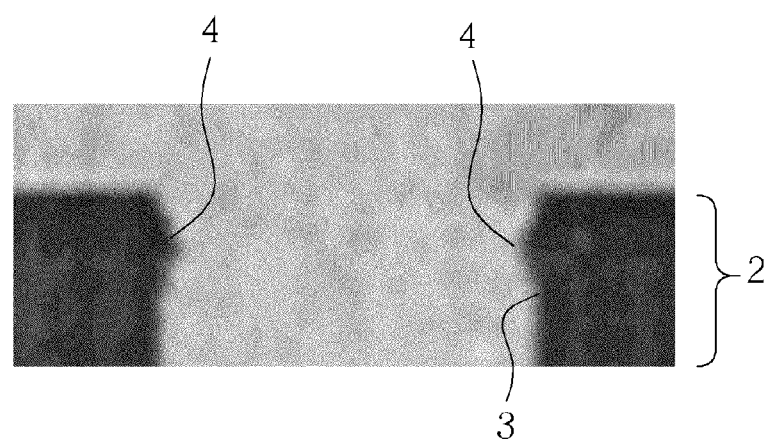
FIG. 2 is a magnification from a part shown in FIG. 1.

The inventors of the present invention researched and found that, for a vertical via hole, an overhang is often formed at the sidewall of the opening near the opening edge during a process of filling the hole with conductive material. The overhang makes the via hole to be not easily fully filled and problems, such as tear drop void, seam void, or bottom void, occur. If the via hole size is increased directly by means of photolithograph and etch processes, the demand for minimization tends to be unsatisfied. Furthermore, in one embodiment as shown in FIGS. 1 and 2, a via hole 1 formed in this way often has a kink 4 formed on the sidewall 3 of the opening portion 2. The kink also induces the formation of overhang during the hole filling process, resulting in, for example, a seam void 5, and thus the quality of the filling is affected.

FIGS. 3-8 illustrate a method of fabricating a TSV structure according to another embodiment of the present invention. It should be noted that the drawing size of the figures does not in a real scale ratio and is just schematic for reference. The same elements of the embodiments may be marked with the same referral numbers.

Figure 3:
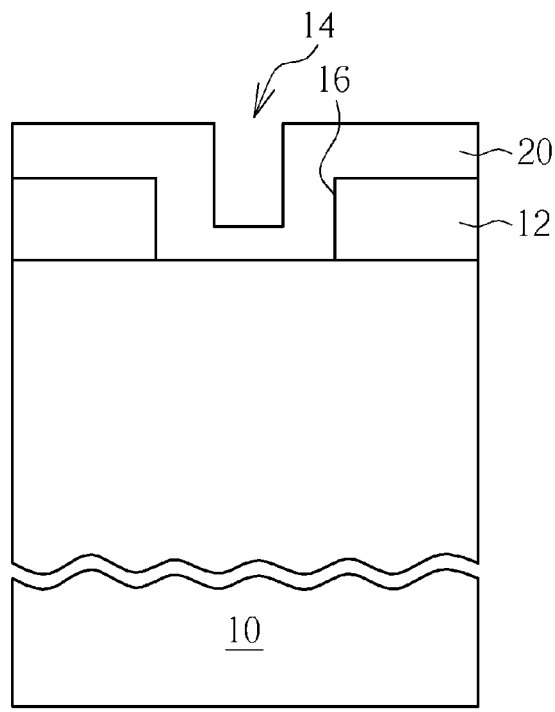
FIGS. 3 to 6 are schematic cross-sectional views illustrating a method of fabricating a TSV structure according to another embodiment of the present invention.
Figure 4:
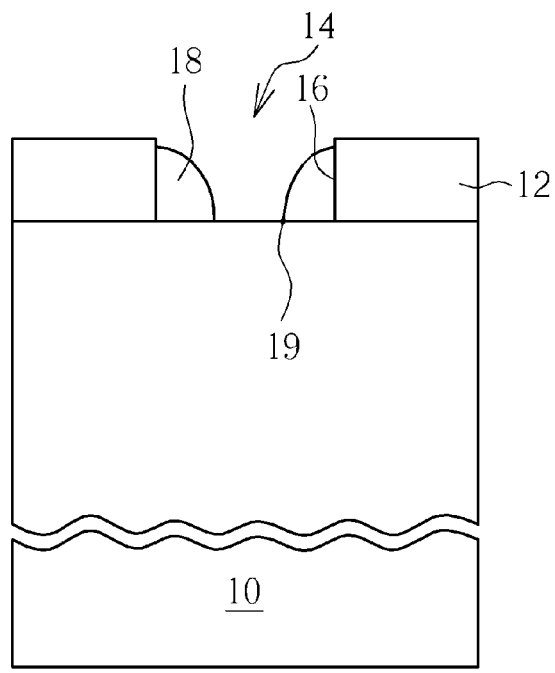

First, referring to FIG. 3, a substrate 10 is provided. The substrate 10 may comprise monocrystalline silicon, gallium arsenide (GaAs), or other material known in the art. The thickness of the substrate 10 may be substantially 700 to 1000 micrometers, but not limited thereto. Some elements, such as semiconductor elements, may have been disposed on the substrate 10. Next, a patterned hard mask 12 having an opening 14 is formed on the substrate 10. The patterned hard mask 12 may be formed using photolithography and etching processes. The material for the patterned hard mask 12 may be selected so that the substrate 10 has a relatively high etching rate with respect to the patterned hard mask 12. For example, when the substrate is silicon, the patterned hard mask 12 may include for example silicon nitride, silicon carbide, silicon carbonitride (Si(C,N)) or the like. Thereafter, a spacer-shaped structure 18 is formed as shown in FIG. 4 on the sidewall 16 of the opening 14. The spacer-shaped structure 18 may be formed by forming a spacer-shaped structure material layer 20 on surface of the patterned hard mask 12 and the sidewall 16 of the opening 14, referring to FIG. 3, and etching back the spacer-shaped structure material layer 20 to form the spacer-shaped structure 18 on the sidewall 16 as shown in FIG. 4. Suitable material for the spacer-shaped structure 18 may have an etch rate different from the patterned hard mask 12. Preferably, the spacer-shaped structure 18 has an etch rate greater than the etch rate of the patterned hard mask 12. When the substrate 10 is a silicon substrate, the material for the spacer-shaped structure 18 may be for example oxide (such as silicon oxide), amorphous carbon film, photoresist material or the like. Etch back may be accomplished by wet etch or dry etch.

When other elements have been disposed or formed on the substrate, the spacer-shaped structure 18 may be preferably formed through a low temperature process in order to prevent the existed elements from harm of high temperature. For example, a low temperature (such as 100° C.) thin film deposition process is performed to form a spacer-shaped structure material layer 20 on the patterned hard mask 12 and the sidewall 16 of the opening 14. The material may be for example a silicon oxide film or a silicon nitride film formed by a low temperature deposition. Thereafter, the spacer-shaped structure material layer 20 is etched back to form a spacer-shaped structure having a predetermined thickness and width. Optionally, a wet etch process may be further performed on the spacer-shaped structure 18 to allow it to have a desired predetermined thickness or width.

Figure 5:
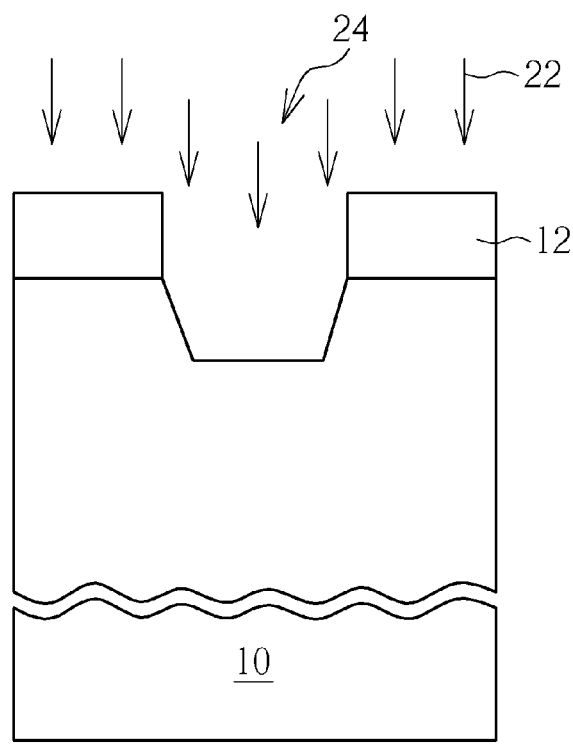
Figure 6:
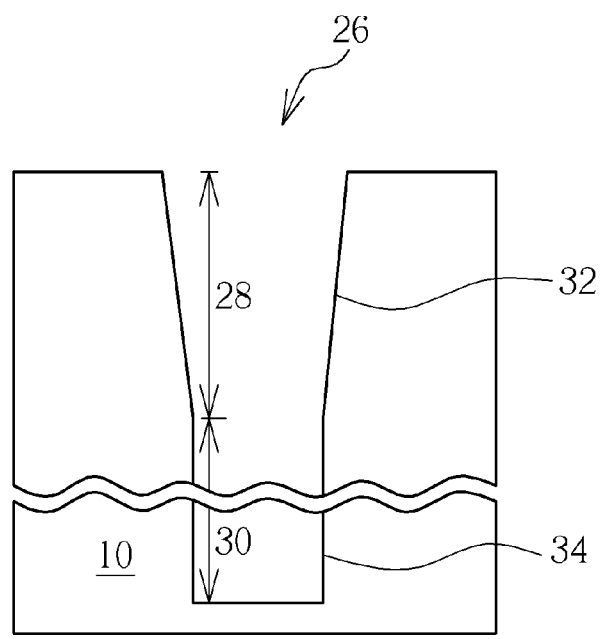

Referring to FIG. 4, after the spacer-shaped structure 18 is formed, the substrate 10 is etched through the opening using the patterned hard mask 12 and the spacer-shaped structure 18 as hard masks to form a via hole. In the embodiment, it is preferably to allow the etch rate of the spacer-shaped structure 18 to be greater than the etch rate of the patterned hard mask 12, but the etch rate of the spacer-shaped structure 18 may be greater or less than, or equal to the etch rate of the substrate 10. During the etch process, the spacer-shaped structure 18 and the substrate 10 exposed from the opening are simultaneously etched and gradually removed. Since the thickness of the spacer-shaped structure 18 substantially gradually decreases in a direction from the sidewall 16 to the opening center, the edge 19 near the opening center will be the thinnest and it will be the first portion to be etched and removed completely. The underlying substrate 10 begins to be etched once the overlying mask is removed. As the spacer-shaped structure 18 is gradually removed in the direction from the edge 19 to the sidewall 16, the area of the underlying substrate 10 to be etched gradually increases in the same direction. Accordingly, a recess having a relatively enlarged opening is formed in the substrate 10. FIG. 5 shows that the spacer-shaped structure 18 is just completely removed through an etch process 22, such as anisotropic dry etch process, and accordingly an opening 24 having a tapered shape is formed in the substrate 10. The etch process 22 may be continuously performed, and the substrate 10 exposed from the opening 24 is etched using the patterned hard mask 12 as a mask after the spacer-shaped structure 18 is completely removed. The etch rate of the substrate 10 at the bottom of the opening 24 is greater than the etch rate of the substrate 10 at the sidewall of the opening 24 due to sidewall effect. Therefore, as shown in FIG. 6, a via hole 26 having an opening portion 28 and a body portion 30 is formed.

The opening portion 28 has a tapered shape having an opening size at the upper portion greater than an opening size at the lower portion. The tapered surface (i.e. the sidewall of the opening portion) may be a plane surface, but not limited thereto, and may be a curve surface or a folded surface, as long as the upper opening size is greater than the lower opening size for the opening portion. The body portion 30 is directly adjacent to the opening portion 28. The body portion 30 has a vertical sidewall, or the lower portion of the sidewall may slightly tilt inwardly but the overall sidewall is substantially vertical. In other words, there is not a significant bending on the sidewall of the body portion 30 in the vertical direction. In one case, the opening size (or it maybe referred to as "hole diameter") at any place of the opening portion 28 will be greater than or equal to the hole diameter of any horizontal cross-section of the body portion 30. In detail, the body portion 30 has a column shape, a substantial column shape, a column shape with a hole diameter of the lower portion gradually decreasing down to the bottom, or a substantial column shape with a hole diameter of the lower portion gradually decreasing down to the bottom. In other words, the body portion 30 is a column-shaped hole or a column-shaped hole with its lower portion hole size gradually slightly decreasing down to the bottom. Herein, "column shape" encompasses any kind of column shape and not limited to a round column shape. An absolute value of a slope of a sidewall 32 of the opening portion 28 is less than an absolute value of a slope of a sidewall 34 of the body portion 30. The via hole 26 may have a hole diameter of about 1 to 20 micrometers and a depth of about 10 to 200 micrometers, or be about 10 micrometers (hole diameter)×about 60 micrometers (hole depth).

The opening portion includes the portion of the via hole from the opening edge to the portion near the opening edge of the via hole, and accordingly its depth is far less than the depth of the body portion 30 and not particularly limited. The slope of the sidewall of the opening, as well as the depth of the opening portion, can be controlled using the thickness (for example 2800 angstroms), the width and the etch selectivity of the spacer-shaped structure. The consumption of the spacer-shaped structure reflects or results in the slope of the sidewall of the opening portion. For example, under the condition of the same thickness and the same width of the spacer-shaped structure, i.e. the spacer-shaped structure of the same shape, the higher the etch selectivity of the substrate to the spacer-shaped structure is, the greater the absolute value of the slope of the sidewall of the opening portion is. In other words, i.e. the higher the etch rate of the substrate with respect to the etch rate of the spacer-shaped structure is, the steeper the sidewall of the opening portion is. Furthermore, for example, under the condition of the same etch selectivity of the substrate to the spacer-shaped structure, the greater the thickness of the spacer-shaped structure is, the greater the absolute value of the slope of the sidewall of the opening portion is, i.e. the steeper the sidewall of the opening portion is. The shape of the bottom of the body portion is substantially corresponding to the shape of substrate exposed from the opening before the etch process, i.e. the shape is corresponding to the width of the spacer-shaped structure. The final shape of the via hole still depends on the result of the etch; however, the via hole has a relatively enlarged opening as compared with a conventional one due to the specific method according to the present invention.

Figure 7:
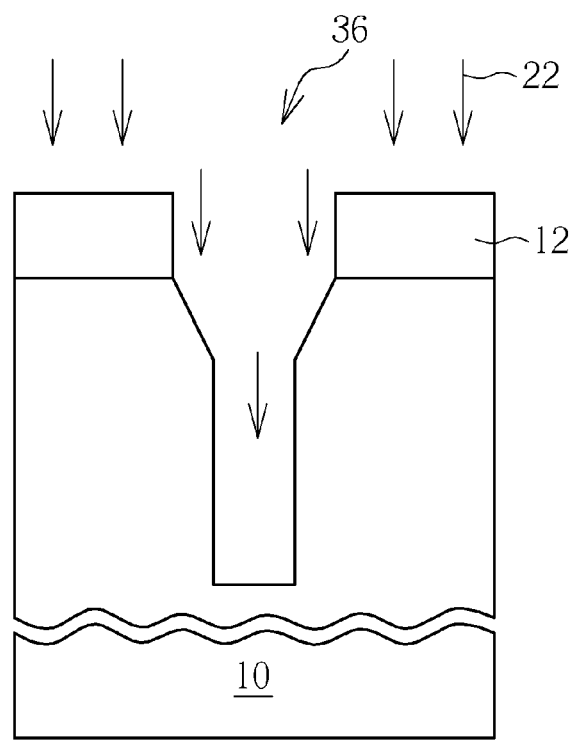
FIGS. 7 to 8 are schematic cross-sectional views illustrating a method of fabricating a TSV structure according to further another embodiment of the present invention.
Figure 8:
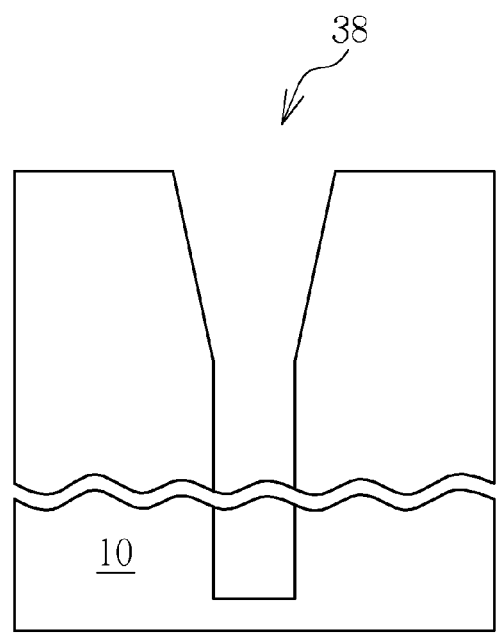

FIGS. 7 and 8 illustrate another embodiment. As shown in FIG. 7, a spacer-shaped structure is just completely removed through an etch process 22, the absolute value of the slope of the sidewall of the opening 36 is greater, i.e. steeper, than the absolute value of the slope of the sidewall of the opening 24 shown in FIG. 5. In addition, since the etch rate of the substrate is greater than the etch rate of the spacer-shaped structure, a column-shaped recess has been already formed in the substrate 10 by etching the substrate 10 exposed from the bottom of the opening 36 in the direction down to the bottom of the substrate 10. The etch process continues to obtain a via hole 38 as shown in FIG. 8. The patterned hard mask 12 may be gradually removed completely along the progress of the etch process, or a portion of the patterned hard mask 12 may remain on the substrate 10 and be further stripped.

Figure 9:
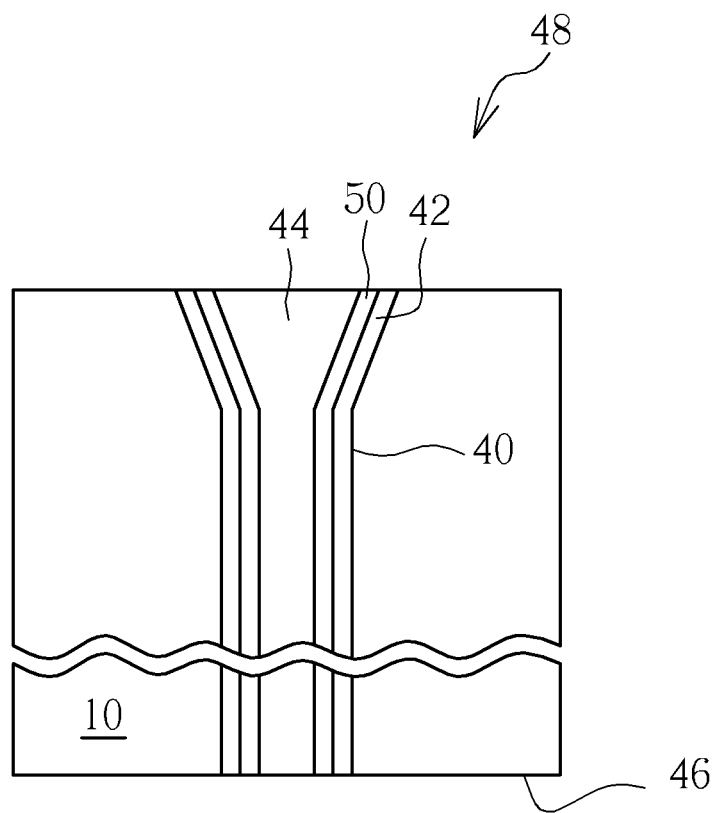
FIG. 9 is a schematic cross-sectional view illustrating a TSV structure according to still another embodiment of the present invention.

After the via hole having an enlarged opening as aforesaid is formed in the substrate, it is filled with conductive material. During the filling process, the liner overhang often induced by the vertical profile can be avoided, and, accordingly, the problem of metal gap fill voiding can be prevented. Referring to FIG. 9, a dielectric liner 42 is formed to cover the sidewall and the bottom of the via hole 40 obtained by the aforesaid method. Thereafter, a conductive material 44 is filled into the via hole 40. Thereafter, a thinning process may be further performed on the substrate 10, for example, by grinding the back side 46 of the substrate 10 using a chemical mechanical polishing (CMP) process, to expose the conductive material 44, giving a TSV structure 48 according to an embodiment of the present invention. The dielectric liner 42 may include a single or multi-layer structure. A barrier layer 50 may be further disposed between the dielectric liner 42 and the conductive material 44 in the via hole. A buffer layer is optionally disposed between the barrier layer 50 and the conductive material 44. The conductive material 44 may include a metal, such as Cu, W, Al, or the like. The barrier layer 50 may include for example Ti/TiN, Ta/TaN, or the like.

The method of fabricating a through silicon via structure according to the present invention may be applied in Frontside or Backside Via-First, Via-Middle, or Via-Last process. In the Frontside Via-Last process, for example, the via hole is formed by an etch process after the completion of both a FEOL (front-end-of-line) process and a BEOL (back-end-of-line) process of IC fabrication, and a dielectric liner, an optional barrier layer, an optional buffer layer and a conductive electrode are formed within the via hole in the order, and, subsequently, a planarization process is performed and the redistribution layer and the bumper are formed to electrically connect to the conductive electrode. In a Via-Middle process, the method according to the present invention is performed between a FEOL process and a BEOL process, so that the redistribution layer and the bumper can be omitted. That is, after forming the TSV structure, the BEOL process is performed to form the metal interconnection system and the contact pads which are electrically connected to the TSV to provide pathways for signal input/output. When the Via-Middle or Via-Last process is employed, the spacer-shaped structure is preferably formed using low temperature processes. In the Via-First process, the TSV structure according to the present invention is formed before a FEOL process of IC fabrication.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a through silicon via structure, comprising:
    forming a patterned hard mask having an opening on a substrate;
    forming a spacer-shaped structure on a sidewall of the opening; and
    after forming the spacer-shaped structure, etching the spacer-shaped structure and the substrate through the opening to form a via hole in the substrate, the via hole having a relatively enlarged opening,
    wherein an etching rate for etching the spacer-shaped structure is between an etching rate for etching the patterned hard mask and an etching rate for etching the substrate.

2. The method according to claim 1, wherein the etching rate for etching the spacer-shaped structure is greater than the etching rate for etching the patterned hard mask.

3. The method according to claim 1, wherein, forming the spacer-shaped structure on the sidewall of the opening comprises:
    performing a low temperature thin film deposition process to form a spacer-shaped structure material layer on the patterned hard mask and the sidewall of the opening; and
    etching back the spacer-shaped structure material layer.

4. The method according to claim 1, wherein, forming the spacer-shaped structure on the sidewall of the opening comprises:
    performing a low temperature thin film deposition process to form a spacer-shaped structure material layer on the patterned hard mask and the sidewall of the opening;
    etching back the spacer-shaped structure material layer to form the spacer-shaped structure; and
    performing a wet etch process to allow the spacer-shaped structure to have a predetermined thickness and width.

5. The method according to claim 2, wherein, etching the spacer-shaped structure and the substrate through the opening to form the via hole in the substrate comprises performing an anisotropic dry etch process.

6. The method according to claim 1, wherein, etching the spacer-shaped structure and the substrate through the opening to form the via hole in the substrate comprises performing an anisotropic dry etch process.

7. The method according to claim 3, wherein, etching the spacer-shaped structure and the substrate through the opening to form the via hole in the substrate comprises performing an anisotropic dry etch process.

8. The method according to claim 4, wherein, etching the spacer-shaped structure and the substrate through the opening to form the via hole in the substrate comprises performing an anisotropic dry etch process.

9. A method of fabricating a through silicon via structure, comprising:
    forming a patterned hard mask having an opening on a substrate;
    performing a low temperature thin film deposition process to form a spacer-shaped structure material layer on the patterned hard mask and a sidewall of the opening;
    etching back the spacer-shaped structure material layer to form a spacer-shaped structure;
    performing a wet etch process to allow the spacer-shaped structure to have a predetermined thickness and width; and
    after forming the spacer-shaped structure, etching the spacer-shaped structure and the substrate through the opening to form a via hole in the substrate, the via hole having a relatively enlarged opening.

10. The method according to claim 9, wherein, etching the spacer-shaped structure and the substrate through the opening to form the via hole in the substrate comprises performing an anisotropic dry etch process.

11. The method according to claim 9, wherein an etching rate for etching the spacer-shaped structure is greater than an etching rate for etching the patterned hard mask.

12. The method according to claim 11, wherein, etching the spacer-shaped structure and the substrate through the opening to form the via hole in the substrate comprises performing an anisotropic dry etch process.

\* \* \* \* \*